(12) United States Patent
Yang et al.

(10) Patent No.: US 11,088,349 B2
(45) Date of Patent: Aug. 10, 2021

(54) DISPLAY MODULE

(71) Applicant: Samsung Display Co., Ltd., Yongin-Si (KR)

(72) Inventors: Donghyun Yang, Seongnam-si (KR); Inkyung Yoo, Hwaseong-si (KR); Sungbae Ju, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/587,489

(22) Filed: Sep. 30, 2019

(65) Prior Publication Data
US 2020/0136088 A1     Apr. 30, 2020

(30) Foreign Application Priority Data

Oct. 24, 2018 (KR) .................. 10-2018-0127510

(51) Int. Cl.
| | |
|---|---|
| *H01L 51/52* | (2006.01) |
| *H01L 27/32* | (2006.01) |
| *G06F 3/041* | (2006.01) |
| *G09G 3/3275* | (2016.01) |
| *G09G 3/3266* | (2016.01) |
| *G09G 3/3233* | (2016.01) |

(52) U.S. Cl.
CPC ...... *H01L 51/5253* (2013.01); *H01L 27/3246* (2013.01); *H01L 27/3258* (2013.01); *G06F 3/041* (2013.01); *G09G 3/3233* (2013.01); *G09G 3/3266* (2013.01); *G09G 3/3275* (2013.01)

(58) Field of Classification Search
None
See application file for complete search history.

(56) References Cited

U.S. PATENT DOCUMENTS

| | | | |
|---|---|---|---|
| 7,183,708 B2 | 2/2007 | Baik et al. | |
| 8,344,396 B2 | 1/2013 | Shim et al. | |
| 2014/0263944 A1* | 9/2014 | Tsai | .......... H01L 27/1464 250/200 |
| 2018/0033830 A1 | 2/2018 | Kim et al. | |
| 2018/0097200 A1 | 4/2018 | Park et al. | |

(Continued)

FOREIGN PATENT DOCUMENTS

| | | |
|---|---|---|
| KR | 100623451 B1 | 9/2006 |
| KR | 1020140080231 A | 6/2014 |

(Continued)

*Primary Examiner* — Robert K Carpenter
(74) *Attorney, Agent, or Firm* — Cantor Colburn LLP

(57) ABSTRACT

A display module includes a base substrate including an upper surface where a display area and a non-display area are defined, a lower surface, and a plurality of side surfaces, a circuit element layer including a planarization layer, a pixel defining layer defining an opening portion that overlaps the display area and exposes a portion of the planarization layer, a display element layer including a first electrode disposed on the planarization layer exposed by the opening part, a light emitting layer, and a second electrode, and a sealing layer disposed on the display element layer. A dam hole is defined, which is adjacent to an edge where two side surfaces of the side surfaces are connected in a plan view of the base substrate, overlaps the non-display area, and penetrates at least one of the planarization layer and the pixel defining layer.

22 Claims, 10 Drawing Sheets

(56) References Cited

U.S. PATENT DOCUMENTS

2018/0122890 A1\* 5/2018 Park .................... H01L 27/3248
2018/0248045 A1\* 8/2018 Lim ........................ H01L 29/04

FOREIGN PATENT DOCUMENTS

| KR | 1020150025994 A | 3/2015 |
|----|----------------|--------|
| KR | 101713277 B1 | 3/2017 |
| KR | 1020180014398 A | 2/2018 |

\* cited by examiner

DISPLAY MODULE

This application claims priority to No. 10-2018-0127510, filed on Oct. 24, 2018, and all the benefits accruing therefrom under 35 U.S.C. § 119, the content of which in its entirety is herein incorporated by reference.

BACKGROUND

1. Field

Exemplary embodiments of the invention herein relate to a display module, and more particularly, to a display module with improved thin film sealing reliability.

2. Description of the Related Art

A display device may be divided into a display area where an image is displayed and a non-display area around the display area. Recently, various studies are in progress in order to increase the display area where the image is displayed by reducing a width of the non-display area.

In addition, among various types of display devices, a light emitting layer of an organic light emitting display device may include an organic material. In order to protect organic materials vulnerable to oxygen and moisture, various techniques for sealing organic light emitting devices are under development. Among the various techniques, a thin film sealing technique is a technique of disposing a sealing layer on the organic light emitting device to block infiltration paths of air and moisture. The sealing layer may include a structure in which an inorganic layer including an inorganic material and an organic material layer including an organic material are alternately stacked.

SUMMARY

As a non-display area is reduced, an area of elements integrated in the non-display area is reduced, so that a resistance may increase. As the resistance increases, a level of a voltage varies depending on a position, and accordingly, image quality may be uneven. In addition, when an organic material overflows in a process of forming an organic material layer, an exposed organic layer may be provided as an infiltration path for air and water.

Exemplary embodiments of the invention provide a display module for displaying an image of uniform quality and improving thin film sealing reliability.

An exemplary embodiment of the invention provides a display module including: a base substrate including an upper surface where a display area and a non-display area are defined, a lower surface, and a plurality of side surfaces connecting the upper surface and the lower surface, a circuit element layer including a planarization layer disposed on the base substrate, a pixel defining layer disposed on the planarization layer and defining an opening portion that overlaps the display area and exposes a portion of the planarization layer, a display element layer including a first electrode disposed on the planarization layer exposed by the opening part, a light emitting layer disposed on the first electrode, and a second electrode disposed on the light emitting layer, and a sealing layer disposed on the display element layer, where a dam hole, which is adjacent to an edge where two side surfaces of the side surfaces are connected in a plan view of the base substrate, overlaps the non-display area, and penetrates at least one of the planarization layer and the pixel defining layer, is defined.

In an exemplary embodiment, the dam hole may include a first hole extending in a first direction and a second hole extending in a second direction intersecting the first direction.

In an exemplary embodiment, the first hole may include a plurality of first main holes extending in the first direction and arranged in the second direction, where the second hole may include a plurality of second main holes extending in the second direction and arranged in the first direction.

In an exemplary embodiment, the first hole may further include a plurality of first sub-holes intersecting the plurality of first main holes, arranged in the first direction, and extending in the second direction, where the second hole may further include a plurality of second sub-holes intersecting the plurality of second main holes, extending in the first direction and arranged in the second direction.

In an exemplary embodiment, in the plan view, the first hole and the second hole may be spaced apart from each other.

In an exemplary embodiment, the plurality of side surfaces may include a first side surface and a third side surface facing each other in a first direction and a second side surface and a fourth side surface facing each other in a second direction intersecting the first direction, where the dam hole may include: a first dam hole adjacent to a first edge to which the first side surface and the second side surface are connected, a second dam hole adjacent to a second edge to which the second side surface and the third side surface are connected, a third dam hole adjacent to a third edge to which the third side surface and the fourth side surface are connected, and a fourth dam hole adjacent to a fourth edge to which the fourth side surface and the first side surface are connected, where the edge is one of the first edge to fourth edge.

In an exemplary embodiment, in the plan view of the based substrate, the first to fourth dam holes may be spaced apart from each other.

In an exemplary embodiment, the sealing layer may cover an entirety of the dam hole and may be disposed on the pixel defining layer.

In an exemplary embodiment, a portion of the second electrode may overlap the sealing layer covering an entirety of the dam hole, and another portion of the second electrode may not overlap the sealing layer.

In an exemplary embodiment, the circuit element layer may further include a power electrode overlapping the non-display area and disposed on the planarization layer, where the another portion of the second electrode may be connected to the power electrode.

In an exemplary embodiment, the circuit element layer may include a plurality of thin film transistors ("TFTs"), where each of the plurality of TFTs may include a pixel electrode connected to the first electrode, where the pixel electrode may be directly covered by the planarization layer.

In an exemplary embodiment of the invention, a display module includes: a base substrate including an upper surface where a display area and a non-display area are defined, a lower surface, and a plurality of side surfaces connecting the upper surface and the lower surface, a circuit element layer including a planarization layer disposed on the base substrate, a pixel defining layer disposed on the planarization layer and defining an opening portion that overlaps the display area and exposes a portion of the planarization layer, a display element layer including a first electrode disposed on the planarization layer exposed by the opening part, a light emitting layer disposed on the first electrode, and a second electrode disposed on the light emitting layer, a dam portion overlapping the non-display area and defined by a first hole and a second hole, the first hole extending in a first direction and penetrating the planarization layer and the pixel defining layer and the second hole extending in a second direction intersecting the first direction and passing through the planarization layer and the pixel defining layer, and a sealing layer covering the dam portion and disposed on the display element layer.

In an exemplary embodiment, the dam portion may include a plurality of dams, where each of the plurality of dams may include: a first layer provided with a same thickness and a same material as that of the planarization layer, and a second layer disposed on the first layer and provided with a same thickness and a same material as that of the pixel defining layer.

In an exemplary embodiment, in a plan view of the base substrate, an area of the first layer may be greater than an area of the second layer.

In an exemplary embodiment, the dam portion may include a first sub-dam portion parallel to the first side surface of the plurality of side surfaces and a second sub-dam portion parallel to the second side surface of the plurality of side surfaces.

In an exemplary embodiment, in a plan view of the base substrate, the first sub-dam portion and the second sub-dam portion may be spaced apart from each other.

In an exemplary embodiment, the first hole may include a plurality of first sub-holes spaced in the second direction, and the second hole may include a plurality of second sub-holes spaced in the first direction.

In an exemplary embodiment, the dam portion may be adjacent to an edge where two side surfaces among the plurality of side surfaces are connected in a plan view of the base substrate.

In an exemplary embodiment, the display module may further include an outer dam portion that does not overlap the sealing layer and is disposed between the edge and the dam portion, in the plan view of the base substrate.

In an exemplary embodiment, the outer dam portion may surround the display area.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
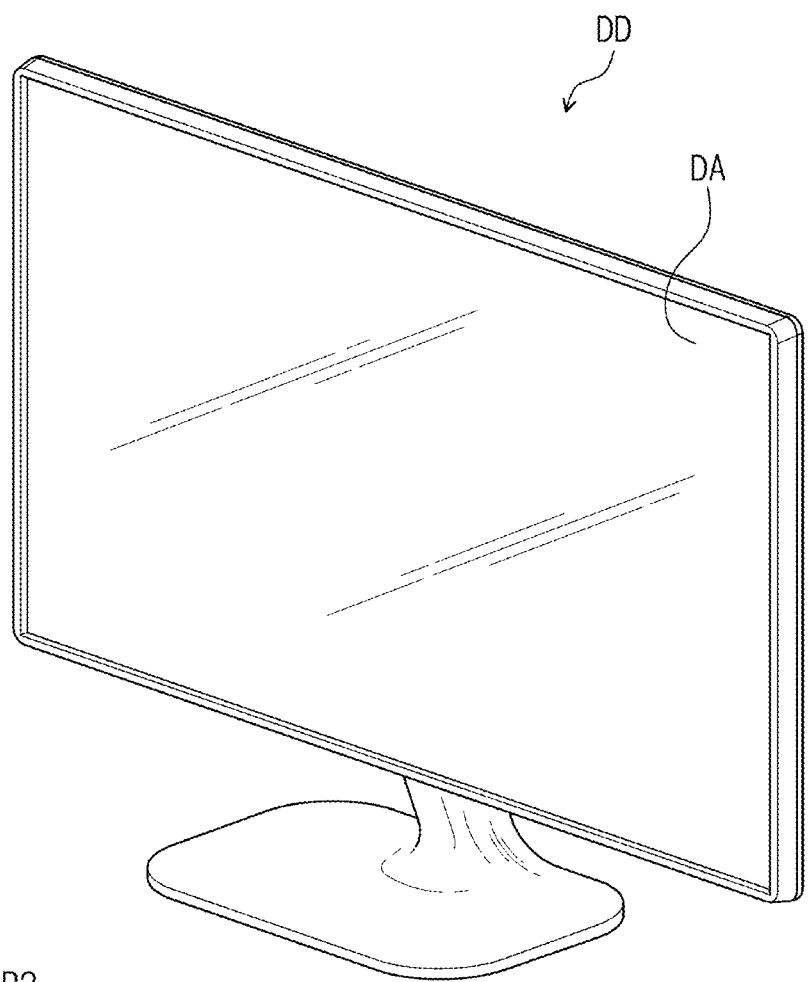
FIG. 1 is a perspective view of an exemplary embodiment of a display device according to the invention.
Figure 1:
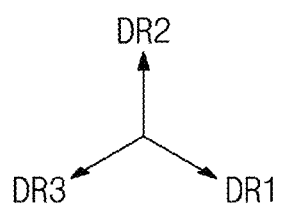

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the invention. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. Also, terms such as terms defined in commonly used dictionaries should be interpreted as having meaning consistent with meaning in the context of the related art, and unless the term is interpreted in an ideal or overly formal sense, they are explicitly defined here.

In various embodiments of the invention, the term "include," "comprise," "including," or "comprising," specifies a property, a region, a fixed number, a step, a process, an element and/or a component but does not exclude other properties, regions, fixed numbers, steps, processes, elements and/or components.

Hereinafter, another exemplary embodiment of the invention will be described with reference to the drawings.

Figure 2:
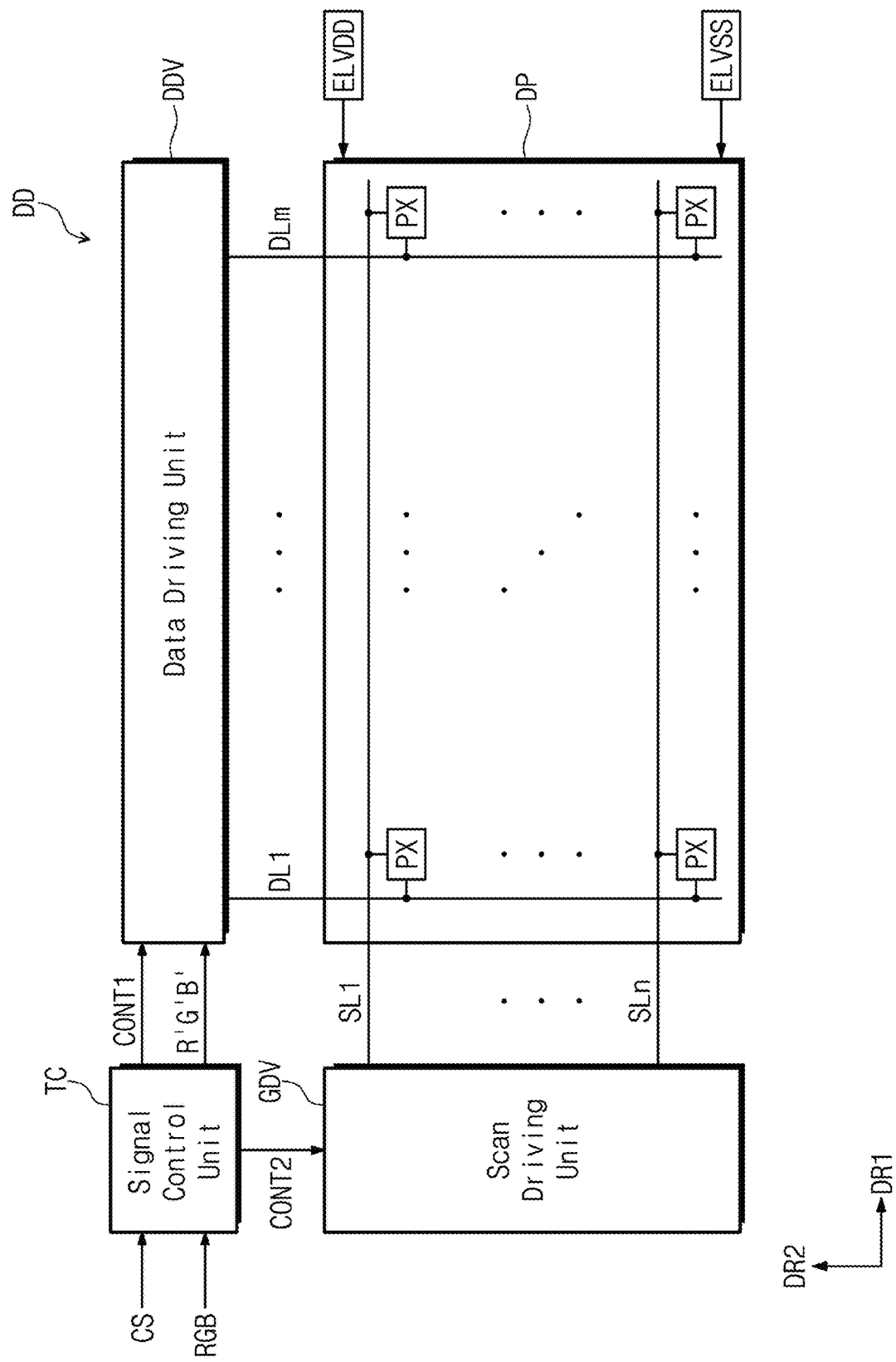
FIG. 2 is a block diagram of an exemplary embodiment of a display device according to the invention.

FIG. 1 is a perspective view of an exemplary embodiment of a display device according to the invention. FIG. 2 is a block diagram of an exemplary embodiment of a display device according to the invention.

Referring to FIG. 1, a display device DD may display an image through a display area DA. In FIG. 1, it is exemplarily shown that the display area DA is provided on a surface defined by a first direction DR1 and a second direction DR2 intersecting the first direction DR1. However, the invention is not limited thereto, and in another exemplary embodiment of the invention, the display area of the display device may be provided on the curved surface. Further, although not shown in FIG. 1, according to another example, the display device DD may further include a non-display area adjacent to the display area DA, and the non-display area may be an area where the image is not visually recognized. The non-display area may be disposed adjacent to one area of the display area DA, or may surround the display area DA.

The thickness direction of the display device DD is indicated by the third direction DR3. The directions that the first to third directions DR1, DR2, and DR3 indicate may be converted to other directions as a relative concept. In this specification, the meaning of "in a plan view" means that it is viewed in the third direction DR3. In addition, "the thickness direction" may be the third direction DR3.

In FIG. 1, it is exemplarily shown that the display device DD is a television. However, the invention is not limited thereto, and in another exemplary embodiment, the display device DD may be used in medium-sized electronic devices such as personal computers, notebook computers, personal digital terminals, car navigation units, game machines, smart phones, tablets, and cameras in addition to large-sized electronic devices such as monitors, or external billboards. In addition, these are simply suggested as exemplary embodiments and it is obvious that they are employed in other electronic devices without departing from the scope of the invention.

Referring to FIG. 2, the display device DD may include a display panel DP, a signal control circuit TC, a data driving circuit DDV, and a scan driving circuit GDV. Each of the signal control circuit TC, the data driving circuit DDV, and the scan driving circuit GDV may include a plurality of circuits.

The display panel DP may include a plurality of data lines DL1 to DLm, a plurality of scan lines SL1 to SLn, and a plurality of pixels PX where m and n are natural numbers.

The plurality of data lines DL1 to DLm may extend in the second direction DR2 and may be arranged along the first direction DR1 that intersects the second direction DR2. The plurality of scan lines SL1 to SLn may extend in the first direction DR1 and may be arranged in the second direction DR2.

Each of the pixels PX may include a light emitting element and a pixel circuit electrically connected to the light emitting element. The pixel circuit may include a plurality of transistors. The first power supply voltage ELVDD and the second power supply voltage ELVSS may be provided in each of the pixels PX.

The pixels PX may be disposed in a regular rule in a plan view of the display panel DP. Each of the pixels PX may display one of the primary colors or one of the mixed colors. In an exemplary embodiment, the primary color may include red, green, and blue, and the mixed color may include various colors such as yellow, cyan, magenta, and white. However, the colors displayed by the pixels PX are not limited thereto.

The signal control circuit TC receives image data RGB provided from the outside. The signal control circuit TC converts the image data RGB to conform to the operation of the display panel DP to generate the converted image data R'G'B' and outputs the converted image data R'G'B' to the data driving circuit DDV.

Further, the signal control circuit TC may receive the control signal CS provided from the outside. The control signal CS may include a vertical synchronization signal, a horizontal synchronization signal, a main clock signal, and a data enable signal. The signal control circuit TC provides the first control signal CONT1 to the data driving circuit DDV and the second control signal CONT2 to the scan driving circuit GDV. The first control signal CONT1 is a signal for controlling the data driving circuit DDV and the second control signal CONT2 is a signal for controlling the scan driving circuit GDV.

The data driving circuit DDV may drive the plurality of data lines DL1 to DLm in response to the first control signal CONT1 received from the signal control circuit TC. In an exemplary embodiment, the data driving circuit DDV is implemented as a separated integrated circuit ("IC") so that it may be electrically connected to one side of the display panel DP or may be directly disposed (e.g., mounted) on the display panel DP. Additionally, the data driving circuit DDV may be implemented as a single chip or may include a plurality of chips.

The scan driving circuit GDV may be integrated in a predetermined area of the display panel DP. In an exemplary embodiment, the scan driving circuit GDV may include a plurality of thin film transistors provided through the same process as the pixel circuit of the pixels PX, for example, a low temperature polycrystalline silicon ("LTPS") process or a low temperature polycrystalline oxide ("LTPO") process, for example. In addition, the scan driving circuit GDV may be implemented as an independent IC chip and electrically connected to one side of the display panel DP.

Figure 3:
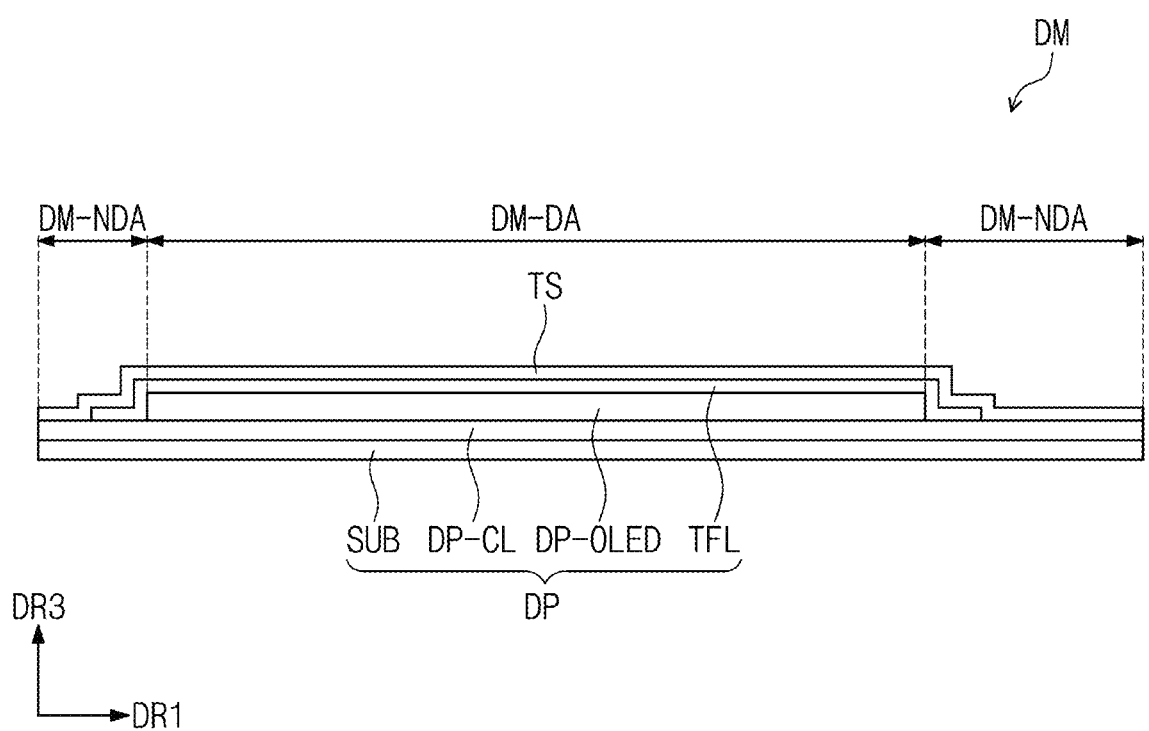
FIG. 3 is a cross-sectional view of an exemplary embodiment of a display module according to the invention.
Figure 4:
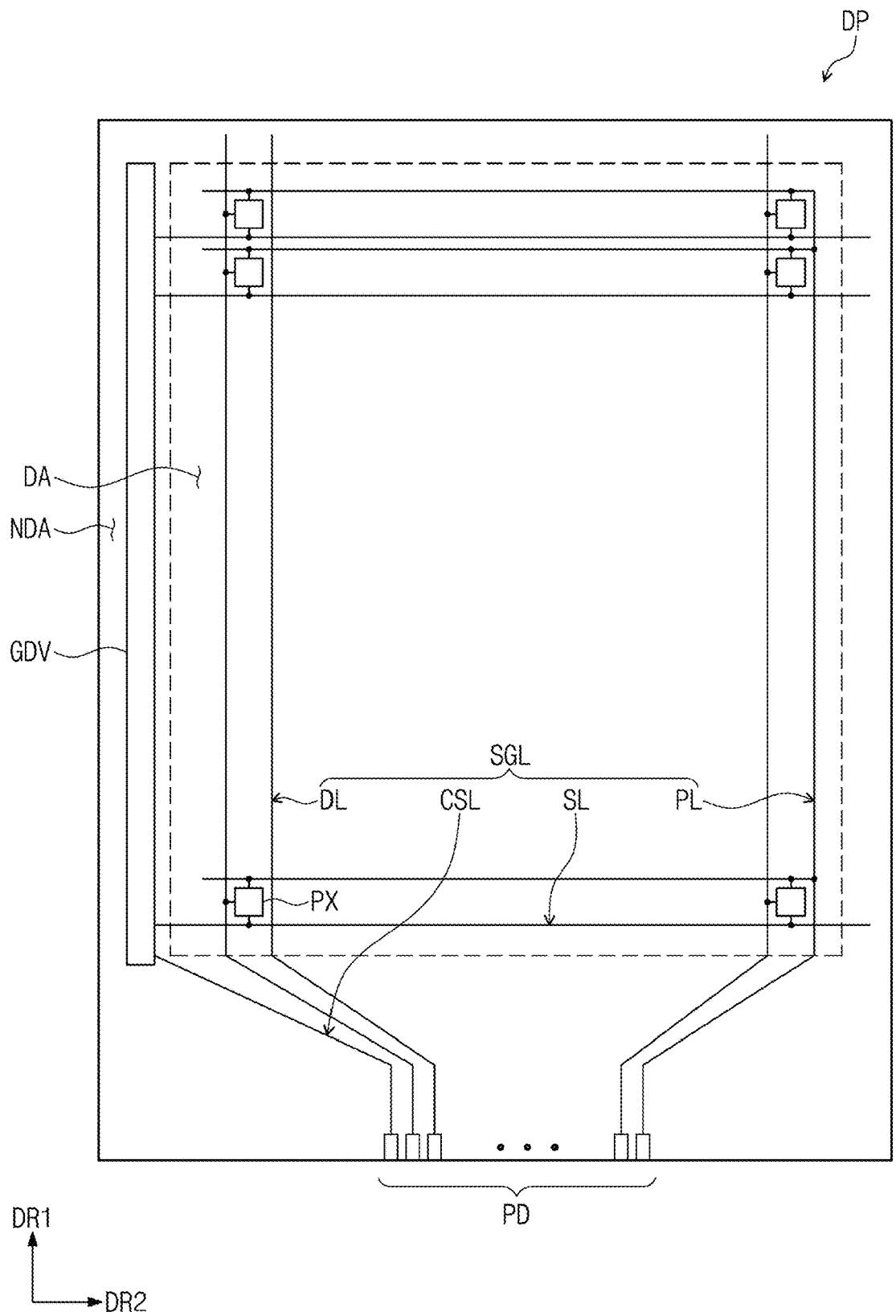
FIG. 4 is a plan view of an exemplary embodiment of a display panel according to the invention.
Figure 5A:
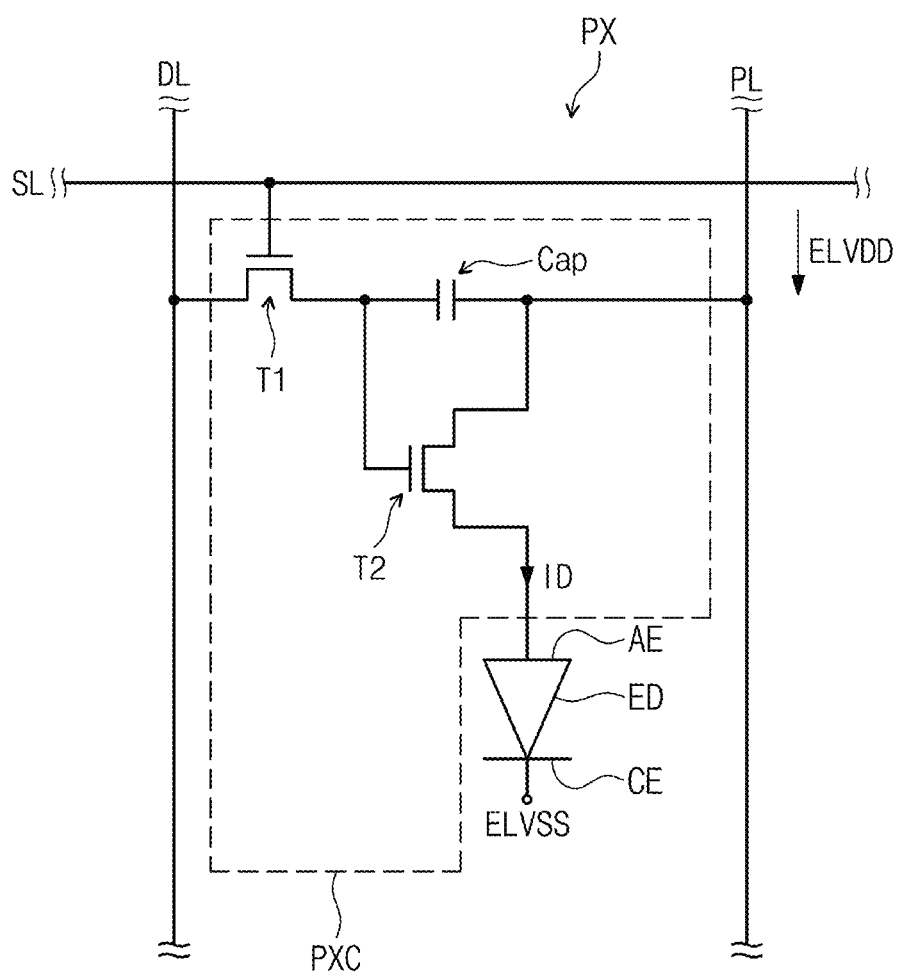
FIG. 5A is an equivalent circuit diagram of an exemplary embodiment of a pixel according to the invention.
Figure 5B:
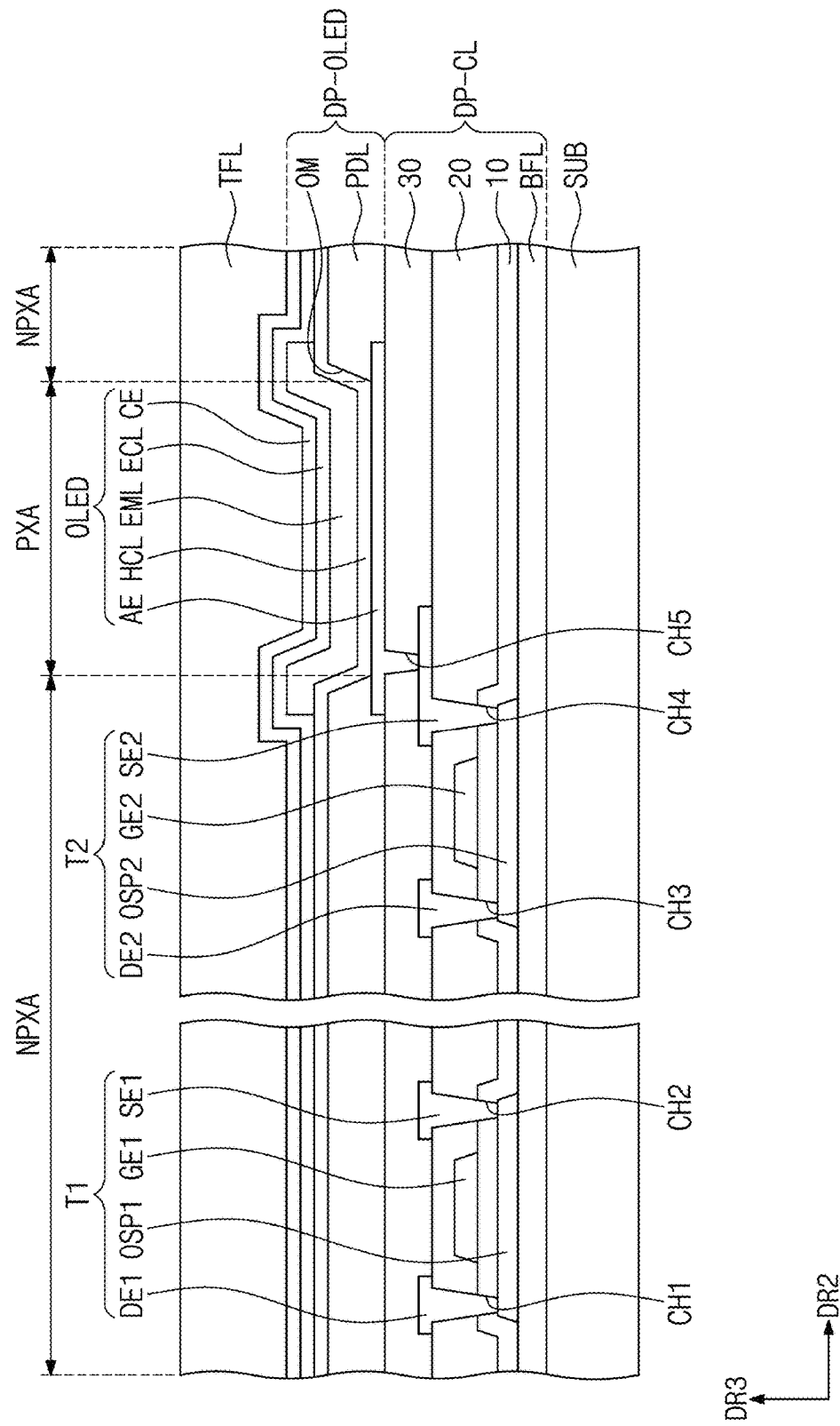
FIG. 5B is a partial cross-sectional view of an exemplary embodiment of a display panel according to the invention.

FIG. 3 is a cross-sectional view of a display module according to an exemplary embodiment of the invention. FIG. 4 is a plan view of a display panel according to an exemplary embodiment of the invention. FIG. 5A is an equivalent circuit diagram of a pixel according to an exemplary embodiment of the invention. FIG. 5B is a partial cross-sectional view of a display panel according to an exemplary embodiment of the invention.

Referring to FIG. 3, the display module DM includes the display panel DP shown in FIG. 2 and additionally an input detection unit (also referred to as touch detection unit) TS. According to the invention, although the display module DM is described as including an input detection unit TS, the input detection unit TS may be omitted.

The input detection unit TS may be disposed directly on the insulating layer TFL. In this specification, "A configuration is directly disposed on B configuration" means that no adhesive layer is disposed between A configuration and B configuration.

The input detection unit TS may be disposed directly on the insulating layer TFL or, in another example, may be connected to the insulating layer TFL through an adhesive layer. The input detection unit TS may include a single layer or a multilayer conductive layer. In addition, the input detection unit TS may include a single layer or a multilayer insulation layer.

The input detection unit TS, for example, may detect an input applied from the outside in a capacitive manner. The externally applied input may be provided in various forms. In an exemplary embodiment, the external input includes various types of external inputs such as a portion of the user's body, a stylus pen, light, heat, or pressure, for example. In addition, an input that a portion of the body, such as a user's hand, touches, as well as an approaching or adjacent space touch (e.g., hovering) may be a form of input.

An operating method of the input detection unit TS according to the invention is not limited especially and the input detection unit TS may detect an external input through an electromagnetic induction method or a pressure detection method. According to another exemplary embodiment of the invention, the input detection unit TS may be separately manufactured and attached to the display panel DP by an adhesive layer, or the input detection unit TS may be omitted.

The display panel DP may be an organic light emitting display panel, and is not particularly limited. In an exemplary embodiment, the display panel DP may be an organic light emitting display panel or a quantum dot light emitting display panel, for example. The organic light emitting display panel includes a light emitting layer including an organic light emitting material. In relation to a quantum dot light-emitting display panel, the light emitting layer includes quantum dot, and quantum rod. Hereinafter, the display panel DP according to the invention is described as an organic light emitting display panel.

The display panel DP includes a base substrate SUB, a circuit element layer DP-CL disposed on the base substrate SUB, a display element layer DP-OLED, and an insulating layer TFL.

The base substrate SUB may include at least one plastic film. The base substrate SUB may include a plastic substrate, a glass substrate, a metal substrate, or an organic/inorganic composite material substrate as a flexible substrate. The display area DA described with reference to FIG. 1 may correspond to the display area DM-DA defined in the base substrate SUB. Further, although not shown in FIG. 1, the display device DD may include a non-display area adjacent to the display area DA. As shown in FIG. 3, the non-display area DM-NDA may be defined on the base substrate SUB, and the non-display area DM-NDA may be adjacent to one side of the display area DM-DA or may surround the display area DM-DA. As another example, the non-display area DM-NDA may be omitted.

The circuit element layer DP-CL includes at least one intermediate insulating layer and circuit elements. The intermediate insulating layer includes at least one intermediate inorganic film and at least one intermediate organic film. The circuit element includes signal lines, a driving circuit of a pixel, and the like.

The display element layer DP-OLED includes at least organic light emitting diodes. The display element layer DP-OLED may further include an organic layer such as a pixel defining layer.

The insulating layer TFL seals the display element layer DP-OLED. As an example, the insulating layer TFL may be a thin-film sealing layer. The insulating layer TFL protects the display element layer DP-OLED from foreign matters such as moisture, oxygen, and dust particles. As shown in FIG. 3, the insulating layer TFL is shown as overlapping each of the display area DM-DA and the non-display area DM-NDA, but it is not limited thereto and may non-overlap the non-display area DM-NDA.

Referring to FIG. 4, the display panel DP includes a display area DA and a non-display area NDA. The display area DA of the display panel DP may correspond to the display area DA of the display device DD shown in FIG. 1.

The display panel DP includes a scan driving circuit GDV, a plurality of signal lines SGL, a plurality of pixels PX, and a plurality of driving pads PD. An area where the plurality of pixels PX is disposed may be defined as the display area DA. The scan driving circuit GDV, the plurality of signal lines SGL, and the pixel driver circuit may be included in the circuit element layer DP-CL shown in FIG. 3.

The scan driving circuit GDV generates a plurality of scan signals and sequentially outputs the plurality of scan signals to a plurality of scan lines SL1 to SLn (refer to FIG. 2). The scan driving circuit GDV may further output another control signal to the driving circuit of the pixels PX.

The plurality of signal lines SGL includes scan lines SL, data lines DL, a power line PL, and a control signal line CSL. The scan lines SL and the data lines DL may correspond to the scan lines SL1 to SLn and the data lines DL1 to DLm shown in FIG. 2.

The scan lines SL are respectively connected to corresponding pixels PX among the plurality of pixels PX, and the data lines DL are respectively connected to corresponding pixels PX among the plurality of pixels PX. The power line PL is connected to the plurality of pixels PX. In addition, the scan driving circuit GDV to which the scan lines SL are connected may be disposed in the non-display area NDA. The control signal line CSL may provide control signals to the scan driving circuit GDV.

Some of the scan lines SL, the data lines DL, the power line PL, and the control signal line CSL are disposed in the same layer and some of them are disposed in different layers. When the signal lines arranged in any one of the scan lines SL, the data lines DL, the power line PL and the control signal line CSL are defined as the first signal lines, the signal lines disposed in another layer may be defined as the second signal lines. Signal lines disposed in another layer may be defined as third signal lines.

The display panel DP may include a plurality of driving pads PD electrically connected to the data lines DL, the power line PL, and the control signal line CSL. The driving pads PD may overlap the non-display area NDA.

Referring to FIG. 5A, a scan line SL, a data line DL, and a pixel PX connected to a power line PL are illustrated. A configuration of the pixel PX is not limited thereto and may be modified and implemented.

According to the invention, the pixel PX includes an organic light emitting element ED, a first electrode AE, a second electrode CE, and a pixel circuit PXC. The pixel PX includes the organic light emitting element ED as a display element.

The organic light emitting element (also referred to as organic light emitting device) ED, the first electrode AE, and the second electrode CE may be included in the display element layer DP-OLED shown in FIG. 3. The organic light emitting element ED may be a front-light-emitting-type diode or a rear-light-emitting-type diode.

The pixel circuit PXC as a circuit portion for driving the organic light emitting element (e.g., organic light emitting diode) ED includes a first transistor T1 (or a switching transistor), a second transistor T2 (or a driving transistor), and a capacitor Cap. The pixel circuit PXC may be included in the circuit element layer DP-CL shown in FIG. 3.

The organic light emitting device ED generates light by an electrical signal provided from the first and second transistors T1 and T2.

The first transistor T1 outputs a data signal applied to the data line DL in response to a scan signal applied to the scan line SL. The capacitor Cap charges a voltage corresponding to a data signal received from the first transistor T1. The first power supply voltage ELVDD is provided to the first electrode AE through the second transistor T2 and the second power supply voltage ELVSS is provided to the second electrode CE. The second power supply voltage ELVSS may be lower than the first power supply voltage ELVDD.

The second transistor T2 is electrically connected to the organic light emitting diode ED through the first electrode AE. The second transistor T2 controls the driving current ID flowing to the organic light emitting element ED in correspondence to the amount of charge stored in the capacitor Cap. The organic light emitting element ED may emit light during a turn-on section of the second transistor T2.

Referring to FIG. 5B, a partial section of a display panel DP corresponding to the equivalent circuit shown in FIG. 5A is shown. The circuit element layer DP-CL, the display element layer DP-OLED, and the insulating layer TFL are sequentially arranged on the base substrate SUB.

The circuit element layer DP-CL includes at least one insulating layer and circuit element. The circuit element includes a signal line, a driving circuit of a pixel, and the like. A circuit element layer DP-CL may be provided through a formation process of an insulating layer, a semiconductor layer, and a conductive layer by coating, a deposition, and the like, and a patterning process of an insulating layer, a semiconductor layer, and a conductive layer by a photolithography process.

The circuit element layer DP-CL may include a buffer film BFL as an inorganic film, a first intermediate inorganic film 10, and a second intermediate inorganic film 20 and include an intermediate organic film 30 as an organic film. The buffer film BFL may include a plurality of stacked inorganic films. The arrangement relationship of the first semiconductor pattern OSP1, the second semiconductor pattern OSP2, the first control electrode GE1, the second control electrode GE2, the first input electrode DE1, the first output electrode SE1, the second input electrode DE2, and the second output electrode SE2 is illustratively shown in FIG. 5B. The first to fifth through holes CH1, CH2, CH3, CH4 and CH5 are also illustrated by way of example.

The display element layer DP-OLED may include an organic light emitting diode OLED. The display element layer DP-OLED includes a pixel defining layer PDL. In an exemplary embodiment, the pixel defining layer PDL may be an organic layer, for example.

The first electrode AE is disposed on the intermediate organic film 30 (hereinafter, also referred to as a planarization layer). The first electrode AE is connected to the second output electrode SE2 through the fifth through hole CH5 passing through the planarization layer 30. An opening portion OM is defined in the pixel defining layer PDL. The opening portion OM of the pixel definition layer PDL exposes at least a portion of the first electrode AE. The opening portion OM of a pixel defining layer PDL is referred to as a light emitting opening portion to distinguish it from other opening parts.

Although not shown separately, spacers overlapping a portion of the pixel defining layer PDL may be disposed on the upper surface of the pixel defining layer PDL. The spacer may be unitary with the pixel defining layer PDL, or may be an insulating structure provided by an additional process.

The display area DA of the display panel DP may include a light emitting area PXA and a non-light emitting area NPXA adjacent to the light emitting area PXA. The non-light emitting area NPXA may surround the light emitting area PXA. According to this exemplary embodiment, the light emitting area PXA is defined corresponding to a partial area of the first electrode AE exposed by the light emitting opening portion OM.

A hole control layer HCL may be commonly disposed in the light emitting area PXA and the non-light emitting area NPXA. The hole control layer HCL may include a hole transport layer and a hole injection layer. A light emitting layer EML is disposed on the hole control layer HCL. The light emitting layer EML may be disposed in an area corresponding to the light emitting opening portion OM. That is, the light emitting layer EML may be provided separately for each of the pixels. The light emitting layer EML may include an organic material and/or an inorganic material. The light emitting layer EML may generate a predetermined colored light.

An electron control layer ECL is disposed on the light emitting layer EML. The electron control layer ECL may include an electron transport layer and may further include an electron injection layer. The hole control layer HCL and the electron control layer ECL may be commonly provided in a plurality of pixels using an open mask. The second electrode CE is disposed on the electron control layer ECL. The second electrode CE has an integral form and is commonly disposed on the electron control layer ECL included in each of the plurality of pixels.

An insulating layer TFL is disposed on the second electrode CE. The insulating layer TFL may be provided as a single sealing layer or as a plurality of thin films. Hereinafter, the insulating layer TFL is described as a sealing layer.

Figure 6:
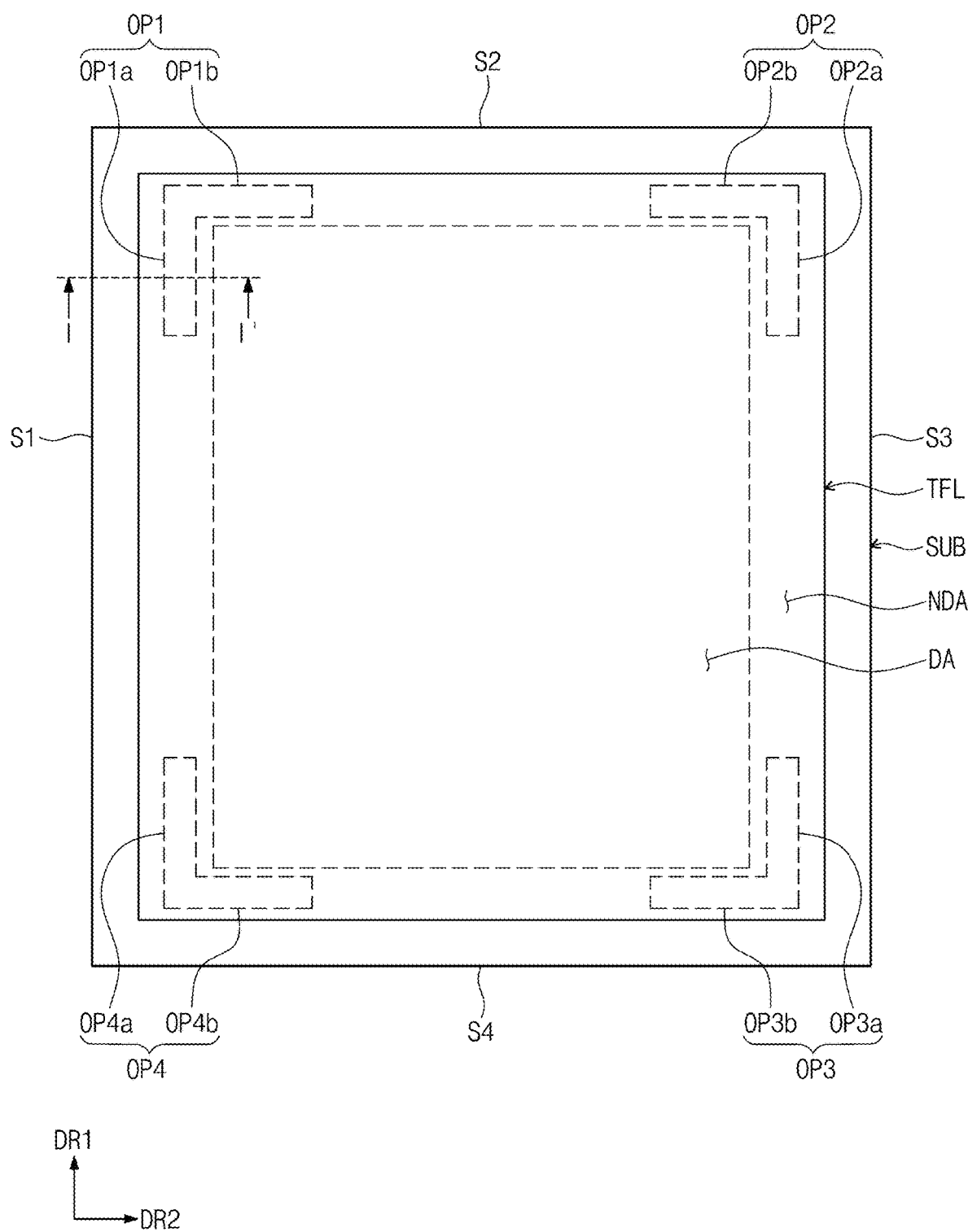
FIG. 6 is a plan view showing an exemplary embodiment of a base substrate and a sealing layer of a display panel according to the invention.
Figure 7A:
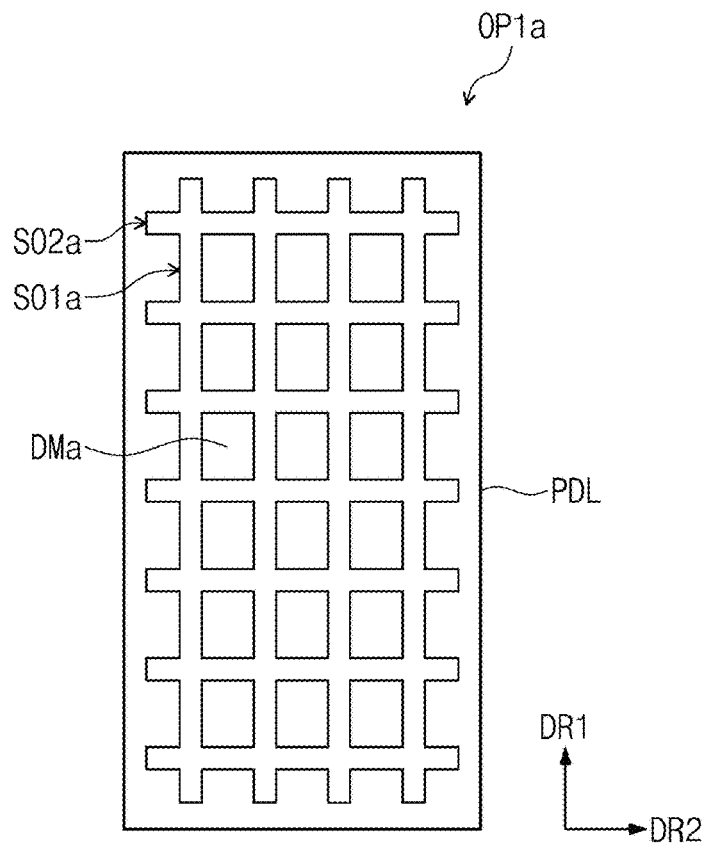
FIG. 7A is an enlarged plan view of a first hole shown in FIG. 6.
Figure 7B:
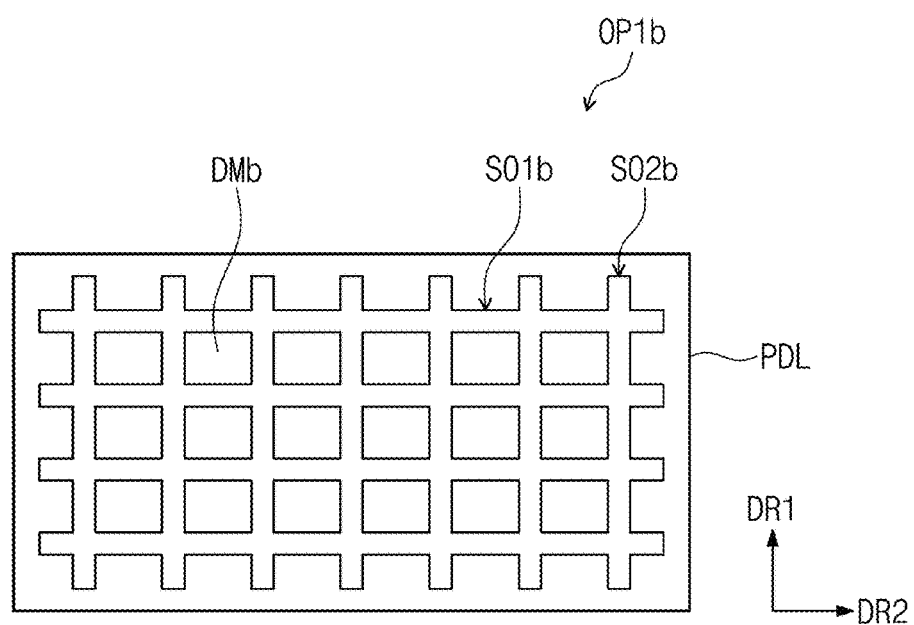
FIG. 7B is an enlarged plan view of a second hole shown in FIG. 6.

FIG. 6 is a plan view showing an exemplary embodiment of a base substrate and a sealing layer of a display panel according to the invention. FIG. 7A is an enlarged plan view of a first hole shown in FIG. 6. FIG. 7B is an enlarged plan view of a second hole shown in FIG. 6.

Referring to FIG. 6, the base substrate SUB may include an upper surface, a lower surface, and first to fourth side surfaces S1, S2, S3, and S4 connecting the upper surface and the lower surface. Here, the upper surface of the base substrate SUB may face the circuit element layer DP-CL (refer to FIG. 5B) and the lower surface of the base substrate SUB may face the upper surface thereof. The first side surface S1 and the third side surface S3 are spaced apart and face each other in the second direction DR2 and the second side surface S2 and the fourth side surface S4 are spaced apart and face each other in the first direction DR1.

As described above, the sealing layer TFL protects the display element layer DP-OLED from foreign matters such as moisture, oxygen, and dust particles. The sealing layer TFL may surround the display area DA. But, when a portion of the sealing layer TFL is peeled off, an external foreign material may be introduced into the display element layer DP-OLED through the peeled portion of the sealing layer. Particularly, there is a high possibility that foreign matters are introduced into the display element layer DP-OLED through a portion of the sealing layer adjacent to the edge where the two side surfaces of the base substrate SUB are connected.

According to an exemplary embodiment of the invention, a dam hole that overlaps the non-display area NDA and penetrates the planarization layer 30 and the pixel defining layer PDL shown in FIG. 5B may be defined. The dam hole may prevent external foreign matter introduced from the peeled portion of the sealing layer from being transmitted to the display element layer DP-OLED.

In detail, in the plan view of the base substrate SUB, the dam hole may be adjacent to the edge where the two adjacent side surfaces of the first to fourth side surfaces S1 to S4 are connected. In an exemplary embodiment, when an external foreign matter is introduced through a peeled portion of the sealing layer, the foreign matter may be filled in the dam hole, for example. As a result, the foreign matter may not be transmitted to the display element layer DP-OLED.

The dam hole according to the invention may include first to fourth dam holes OP1, OP2, OP3, and OP4 that pass through the planarization layer 30 and the pixel defining layer PDL and are covered by the sealing layer TFL. In the plan view, the first to fourth dam holes OP1, OP2, OP3, and OP4 may be disposed between the outermost portions of the display area DA and the sealing layer TFL. Further, in the plan view, the first to fourth dam holes OP1, OP2, OP3, and OP4 may be spaced apart from each other.

The first dam hole OP1 may be adjacent to the first edge of the base substrate SUB to which the first side surface S1 and the second side surface S2 are connected. The first dam hole OP1 includes a first hole OP1a extending in a first direction DR1 and a second hole OP1b extending in a second direction DR2. In an exemplary embodiment, the second hole OP1b may be provided in a shape extending from the first hole OP1a, for example.

The second dam hole OP2 may be adjacent to the second edge of the base substrate SUB to which the second side surface S2 and the third side surface S3 are connected. The second dam hole OP2 includes a first hole OP2a extending in a first direction DR1 and a second hole OP2b extending in a second direction DR2. In an exemplary embodiment, the second hole OP2b may be provided in a shape extending from the first hole OP2a, for example.

The third dam hole OP3 may be adjacent to the third edge of the base substrate SUB to which the third side surface S3 and the fourth side surface S4 are connected. The third dam hole OP3 includes a first hole OP3a extending in a first direction DR1 and a second hole OP3b extending in a second direction DR2. In an exemplary embodiment, the second hole OP3b may be provided in a shape extending from the first hole OP3a, for example.

The fourth dam hole OP4 may be adjacent to the fourth edge of the base substrate SUB to which the fourth side surface S4 and the first side surface S1 are connected. The fourth dam hole OP4 includes a first hole OP4a extending in a first direction DR1 and a second hole OP4b extending in a second direction DR2. In an exemplary embodiment, the second hole OP4b may be provided in a shape extending from the first hole OP4a, for example.

Referring to FIG. 7A, one first hole OP1a among the first holes OP1a, OP2a, OP3a, and OP4a is illustratively shown. According to the invention, for convenience of explanation, although the first hole OP1a is described mainly, the remaining first holes OP2a, OP3a, and OP4a may also be provided in the shape shown in FIG. 7A.

As shown in FIG. 7A, the first hole OP1a includes a plurality of first main holes SO1a extending in a first direction DR1 and arranged in a second direction DR2, and a plurality of first sub-holes SO2a arranged in the first direction DR1 and extending in the second direction DR2. The first main holes SO1a and the first sub-holes SO2a may pass through and may intersect each other.

The first main holes SO1a may be parallel to the first direction DR1 in which the first side surface S1 or the third side surface S3 extends. The first sub-holes SO2a may be parallel to the second direction DR2 in which the second side surface S2 and the fourth side surface S4 extend.

According to an exemplary embodiment of the invention, the first sub dam portion may be defined by the first hole OP1a. That is, the first sub-dam portion includes a plurality of first dams DMa defined by the first main holes SO1a and first sub-holes SO2a passing through the planarization layer 30 and the pixel defining layer PDL. Illustratively, the first dams DMa may be arranged in a matrix shape.

Also, according to another example of the invention, when the first sub-holes SO2a are omitted, the first hole OP1a may include only the first main holes SO1a. In this case, the first sub-dam portion is defined by two main holes adjacent to each other among the first main holes SO1a and may be provided in a shape extending in the first direction DR1.

Referring to FIG. 7B, one second hole OP1b among the second holes OP1b, OP2b, OP3b, and OP4b is illustratively shown. According to the invention, for convenience of explanation, although the second hole OP1b is described mainly, the remaining second holes OP2b, OP3b, and OP4b may also be provided in the shape shown in FIG. 7B.

As shown in FIG. 7B, the second holes OP1b includes a plurality of second main holes SO1b extending in a second direction DR2 and arranged in a first direction DR1, and a plurality of second sub-holes SO2b arranged in the second direction DR2 and extending in the first direction DR1. The first sub-holes SO2a and the second sub-holes SO2b may pass through the pixel defining layer PDL and the planarization layer 30, and may intersect each other.

The second main holes SO1b may be parallel to the second direction DR2 in which the second side surface S2 or the fourth side surface S4 extends. The second sub-holes SO2a may be parallel to the first direction DR1 in which the first side surface S1 or the third side surface S3 extends.

According to an exemplary embodiment of the invention, the second sub-dam portion may be defined by the second hole OP1b. The second sub-dam portion includes a plurality of second dams DMb defined by the second main holes SO1b and second sub-holes SO2b passing through the planarization layer 30 and the pixel defining layer PDL. Illustratively, the second dams DMb may be arranged in a matrix shape.

Also, according to another example of the invention, when the second sub-holes SO2b are omitted, the second hole OP1b may include only the second main holes SO1b. In this case, the second sub-dam portion is defined by two main holes adjacent to each other among the second main holes SO1b and may be provided in a shape extending in the second direction DR2.

According to an exemplary embodiment of the invention, foreign matter introduced into the sealing layer TFL through the first edge of the base substrate SUB may be filled in the first hole OP1a and the second hole OP1b. In other words, as the foreign matter is filled in the first hole OP1a and the second hole OP1b, the foreign matter may be prevented from being transmitted to the display element layer DP-OLED.

Although not separately described, the foreign matter introduced into the sealing layer TFL through the second to fourth edges of the base substrate SUB may be also prevented from being transmitted to the display element layer DP-OLED by the second to fourth dam holes OP2, OP3, and OP4. The structure of the second to fourth dam holes OP2, OP3, and OP4 may be substantially the same as that of the first dam hole OP1 described above. Accordingly, description for this is omitted.

Figure 8:
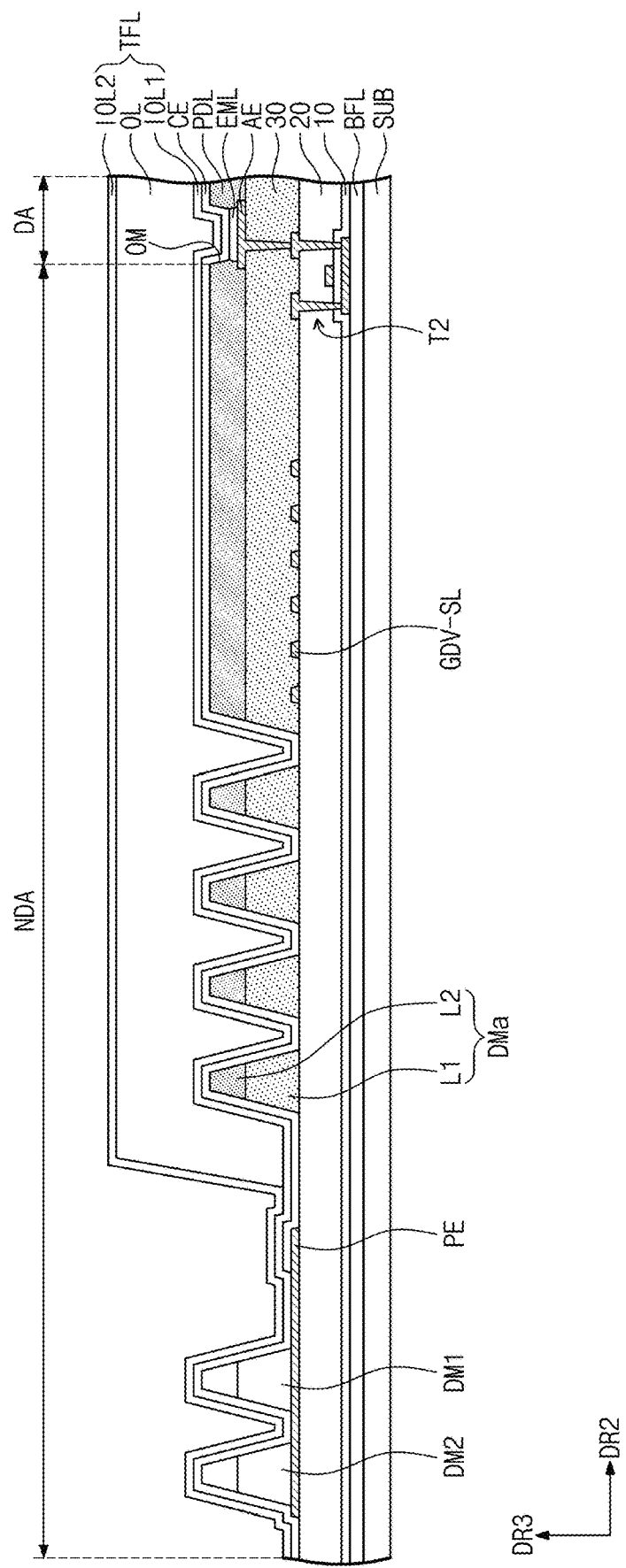
FIG. 8 is a cross-sectional view taken along line I-I' shown in FIG. 6.

FIG. 8 is a cross-sectional view taken along line I-I' shown in FIG. 6.

FIG. 8 shows a structure that is substantially the same as those of the base substrate SUB, the circuit element layer DP-CL, the display element layer DP-OLED, and the sealing layer TFL described with reference to FIG. 5B. It is described with reference to FIG. 8 that the circuit element layer DP-CL includes a second transistor T2 connected to the display element layer DP-OLED (refer to FIG. 5B), signal lines GDV-SL included in the scan driving circuit GDV, and a power electrode PE. The signal lines GDV-SL and the power electrode PE may overlap the non-display area NDA and may be disposed on the second intermediate inorganic film 20.

Specifically, referring to FIG. 8, the first dams DMa that overlap the non-display area NDA shown through FIG. 7A and are defined by the first main holes SO1a and the first sub-holes SO2a are shown. The first dams DMa may be spaced apart from each other in the second direction DR2.

According to an exemplary embodiment of the invention, each of the first dams DMa includes a first layer L1 and a second layer L2 disposed on the first layer L1. The first layer L1 may be provided with the same thickness and the same material as that of the planarization layer 30. In an exemplary embodiment, the first layer L1 may be provided at the same time when the planarization layer 30 is deposited, for example. The second layer L2 may be provided with the same thickness and the same material as those of the pixel defining layer PDL. In an exemplary embodiment, the second layer L2 may be provided at the same time when a pixel defining layer PDL is deposited, for example.

Particularly, according to the invention, in the plan view, the area of the first layer L1 may be larger than the area of the second layer L2. Therefore, the outer surface of each of the first dams DMa composed of the first layer L1 and the second layer L2 may be inclined.

According to an exemplary embodiment of the invention, the sealing layer TFL may cover an entirety of the first dams DMa. In this case, as the sealing layer TFL covers the first dams DMa, the area of the sealing layer TFL may be increased compared to the case where the first dams are omitted. As a result, around the edge where the first dams DMa are disposed, the bonding between the sealing layer TFL and the display element layer DP-OLED may be improved.

The second electrode CE may cover the entire first dams DMa and may be disposed on the pixel defining layer PDL. The sealing layer TFL may cover the entire first dams DMa and may be disposed on the second electrode CE.

A portion of the second electrode CE overlaps the sealing layer TFL, and another portion of the second electrode CE may not overlap the sealing layer TFL and may be connected to the power electrode PE disposed on the planarization layer 30. The power electrode PE may deliver a second power supply voltage ELVSS to the second electrode CE. The power electrode PE may not overlap the sealing layer TFL and may be disposed in the non-display area NDA.

The first outer dam DM1 and the second outer dam DM2, which are spaced apart from each other in the plan view, may be disposed on the power electrode PE. The first outer dam DM1 and the second outer dam DM2 may be provided as a single layer or as a laminated structure. Referring to FIG. 8, it is shown that each of the first outer dam DM1 and the second outer dam DM2 is provided with the same structure and the same material as that of the first dams DMa. However, the invention is not limited thereto, and the structures of the first outer dam DM1 and the second outer dam DM2 may be provided in a single-layer structure or may be provided in a different shape from the first dams DMa.

The first outer dam DM1 may be a single layer and may be provided simultaneously with the planarization layer 30 and the pixel defining layer PDL. Since the first outer dam DM1 is provided by the same process as the planarization layer 30 and the pixel defining layer PDL, it may have the same thickness and may include the same material.

The second outer dam DM2 may be closer to the end of the base substrate SUB than the first outer dam DM1 is to the end of the base substrate SUB. The second outer dam DM2 may be disposed outside the first outer dam DM1. In an exemplary embodiment, the shortest distance between the first outer dam DM1 and the display area DA may be less than the shortest distance between the second outer dam DM2 and the display area DA, for example.

According to one example, the first outer dam DM1 and the second outer dam DM2 may surround the display area DA. According to another example, the first outer dam DM1 and the second outer dam DM2 may be adjacent to at least one area of the display area DA.

In addition, the first outer dam DM1 and the second outer dam DM2 may have the same effect as that of the first dams DMa of the invention described above.

The sealing layer TFL may include a first inorganic layer IOL1, an organic layer OL, and a second inorganic layer IOL2, which are sequentially stacked.

The first inorganic layer IOL1 may cover the first dams DMa, the first outer dam DM1, and the second outer dam DM2. In an exemplary embodiment, the end of the first inorganic layer IOL1 may contact the second intermediate inorganic film 20, for example. The organic layer OL may be disposed on the first inorganic layer IOL1 and may cover the first dams DMa.

The second inorganic layer IOL2 may cover the first dams DMa, the first outer dam DM1, and the second outer dam DM2. The end of the second inorganic layer IOL2 may contact the first inorganic layer IOL1.

Although not shown in the drawing, an input detection unit TS (refer to FIG. 3) may be disposed on the second inorganic layer IOL2. The input detection unit TS may overlap the display area DA and may be disposed directly on the second inorganic layer IOL2 or may be disposed on the second inorganic layer IOL2 through a separate adhesive member.

Figure 9:
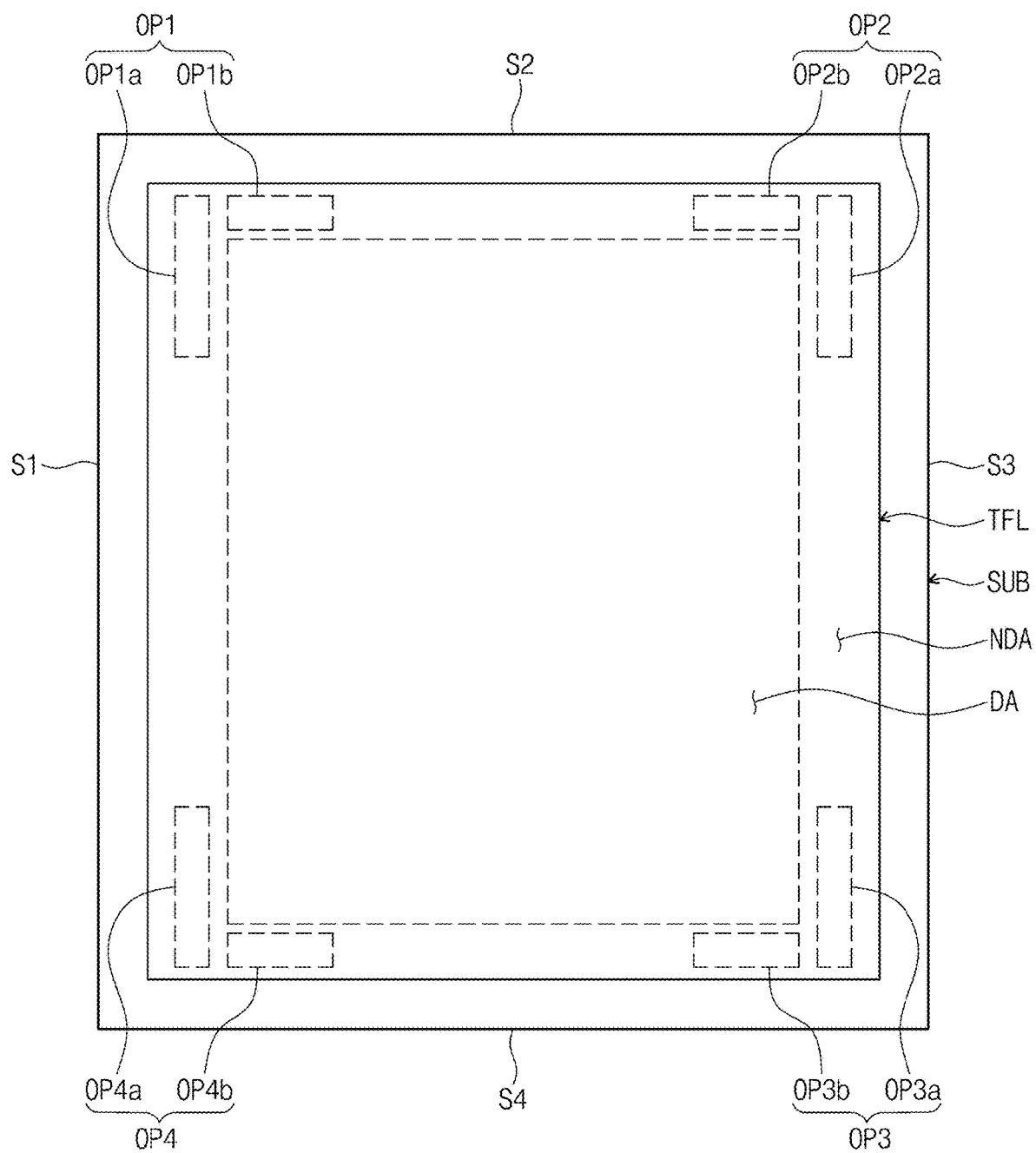
FIG. 9 is a plan view showing another exemplary embodiment of a base substrate and a sealing layer of a display panel according to the invention.

FIG. 9 is a plan view showing another exemplary embodiment of a base substrate and a sealing layer of a display panel according to the invention.

In comparison to the plan view shown in FIG. 6, in the plan view shown in FIG. 9, the structures of the first holes OP1a, OP2a, OP3a, and OP4a and the second holes OP1b, OP2b, OP3b, and OP4b are different, and the remaining structures may be substantially the same.

According to an exemplary embodiment of the invention, in the plan view, the first sub-dam portion and the second sub-dam portion may be spaced apart from each other. That is, in the plan view, the first hole OP1a and the second hole OP1b may be spaced from each other.

According to an exemplary embodiment of the invention, the dam portion is defined by a first hole extending in a first direction and passing through the planarization layer and the pixel defining layer, and a second hole extending in a second direction intersecting the first direction and passing through the planarization layer and the pixel defining layer. The dam is covered by a sealing layer to prevent foreign matter from being transmitted to the display element layer. Also, as the sealing layer covers the dam, the overall area of the sealing layer may be increased. As a result, the bonding force between the sealing layer and the display element layer in the corner region may be increased.

Accordingly, it is possible to provide a display module for displaying an image of uniform image quality and improving thin film sealing reliability.

Although the exemplary embodiments of the invention have been described, it is understood that the invention should not be limited to these exemplary embodiments but various changes and modifications may be made by one ordinary skilled in the art within the spirit and scope of the invention as hereinafter claimed.

What is claimed is:

1. A display module comprising:
  a base substrate including an upper surface where a display area and a non-display area are defined, a lower surface, and a plurality of side surfaces connecting the upper surface and the lower surface;

a circuit element layer including a planarization layer disposed on the base substrate;

a pixel defining layer disposed on the planarization layer and defining an opening portion which overlaps the display area and exposes a portion of the planarization layer;

a display element layer including a first electrode disposed on the planarization layer exposed by the opening portion, a light emitting layer disposed on the first electrode, and a second electrode disposed on the light emitting layer; and a sealing layer disposed on the display element layer, wherein a dam hole, which is adjacent to an edge where two side surfaces of the plurality of side surfaces are connected in a plan view of the base substrate, overlaps the non-display area, and penetrates at least one of the planarization layer and the pixel defining layer, is defined.

2. The display module of claim 1, wherein the dam hole comprises a first hole extending in a first direction and a second hole extending in a second direction intersecting the first direction.

3. The display module of claim 2, wherein the first hole comprises a plurality of first main holes extending in the first direction and arranged in the second direction, wherein the second hole comprises a plurality of second main holes extending in the second direction and arranged in the first direction.

4. The display module of claim 3, wherein the first hole further comprises a plurality of first sub-holes intersecting the plurality of first main holes, arranged in the first direction, and extending in the second direction, wherein the second hole further comprises a plurality of second sub-holes intersecting the plurality of second main holes, extending in the first direction, and arranged in the second direction.

5. The display module of claim 3, wherein in the plan view, the first hole and the second hole are spaced apart from each other.

6. The display module of claim 1, wherein the plurality of side surfaces comprises a first side surface and a third side surface facing each other in a first direction and a second side surface and a fourth side surface facing each other in a second direction intersecting the first direction, wherein the dam hole comprises:

a first dam hole adjacent to a first edge to which the first side surface and the second side surface are connected;

a second dam hole adjacent to a second edge to which the second side surface and the third side surface are connected;

a third dam hole adjacent to a third edge to which the third side surface and the fourth side surface are connected; and a fourth dam hole adjacent to a fourth edge to which the fourth side surface and the first side surface are connected, wherein the edge is one of the first edge to fourth edge.

7. The display module of claim 6, wherein in the plan view of the base substrate, the first to fourth dam holes are spaced apart from each other.

8. The display module of claim 1, wherein the sealing layer covers an entirety of the dam hole and is disposed on the pixel defining layer.

9. The display module of claim 1, wherein the circuit element layer comprises a plurality of thin film transistors, wherein each of the plurality of thin film transistors comprises a pixel electrode connected to the first electrode, wherein the pixel electrode is directly covered by the planarization layer.

10. The display module of claim 1, wherein the light emitting layer includes quantum dot and quantum rod.

11. A display module comprising:

a base substrate including an upper surface where a display area and a non-display area are defined, a lower surface, and a plurality of side surfaces connecting the upper surface and the lower surface;

a circuit element layer including a planarization layer disposed on the base substrate;

a pixel defining layer disposed on the planarization layer and defining an opening portion which overlaps the display area and exposes a portion of the planarization layer;

a display element layer including a first electrode disposed on the planarization layer exposed by the opening part, a light emitting layer disposed on the first electrode, and a second electrode disposed on the light emitting layer; and a sealing layer disposed on the display element layer, wherein a dam hole, which is adjacent to an edge where two side surfaces of the plurality of side surfaces are connected in a plan view of the base substrate, overlaps the non-display area, and penetrates at least one of the planarization layer and the pixel defining layer, is defined, wherein a portion of the second electrode overlaps the sealing layer covering an entirety of the dam hole, and another portion of the second electrode does not overlap the sealing layer.

12. The display module of claim 11, wherein the circuit element layer further comprises a power electrode overlapping the non-display area and disposed on the planarization layer, wherein the another portion of the second electrode is connected to the power electrode.

13. A display module comprising:

a base substrate including an upper surface where a display area and a non-display area are defined, a lower surface, and a plurality of side surfaces connecting the upper surface and the lower surface;

a circuit element layer including a planarization layer disposed on the base substrate;

a pixel defining layer disposed on the planarization layer and defining an opening portion which overlaps the display area and exposes a portion of the planarization layer;

a display element layer including a first electrode disposed on the planarization layer exposed by the opening part, a light emitting layer disposed on the first electrode, and a second electrode disposed on the light emitting layer;

a dam portion overlapping the non-display area and defined by a first hole and a second hole, the first hole extending in a first direction and penetrating the planarization layer and the pixel defining layer and the second hole extending in a second direction intersecting the first direction and passing through the planarization layer and the pixel defining layer; and a sealing layer covering the dam portion and disposed on the display element layer.

14. The display module of claim 13, wherein the dam portion comprises a plurality of dams, wherein each of the plurality of dams comprises:
  a first layer provided with a same thickness and a same material as that of the planarization layer; and
  a second layer disposed on the first layer and provided with a same thickness and a same material as that of the pixel defining layer.

15. The display module of claim 14, wherein in a plan view of the base substrate, an area of the first layer is greater than an area of the second layer.

16. The display module of claim 13, wherein the dam portion comprises a first sub-dam portion parallel to a first side surface of the plurality of side surfaces and a second sub-dam portion parallel to a second side surface of the plurality of side surfaces.

17. The display module of claim 16, wherein in a plan view of the base substrate, the first sub-dam portion and the second sub-dam portion are spaced apart from each other.

18. The display module of claim 13, wherein the first hole comprises a plurality of first sub-holes spaced in the second direction, and the second hole comprises a plurality of second sub-holes spaced in the first direction.

19. The display module of claim 13, wherein the dam portion is adjacent to an edge where two side surfaces among the plurality of side surfaces are connected in a plan view of the base substrate.

20. The display module of claim 19, further comprising an outer dam portion which does not overlap the sealing layer and is disposed between the edge and the dam portion, in the plan view of the base substrate.

21. The display module of claim 20, wherein the outer dam portion surrounds the display area.

22. The display module of claim 13, wherein the light emitting layer includes quantum dot and quantum rod.

* * * * *